United States Patent
Lin

(10) Patent No.: US 10,444,782 B1
(45) Date of Patent: Oct. 15, 2019

(54) DIGITAL REGULATOR

(71) Applicant: Winbond Electronics Corp., Taichung (TW)

(72) Inventor: Chih-Feng Lin, Zhubei (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/292,581

(22) Filed: Mar. 5, 2019

(30) Foreign Application Priority Data

May 16, 2018 (TW) .............................. 107116589 A

(51) Int. Cl.
| | |
|---|---|
| *G05F 3/24* | (2006.01) |
| *H03K 19/0175* | (2006.01) |
| *H03K 19/20* | (2006.01) |
| *H03K 5/00* | (2006.01) |
| *G05F 1/56* | (2006.01) |
| *G05F 1/575* | (2006.01) |
| *G05F 1/565* | (2006.01) |
| *H02M 3/157* | (2006.01) |

(52) U.S. Cl.
CPC ....... *G05F 3/24* (2013.01); *H03K 19/017509* (2013.01); *H03K 19/20* (2013.01); *G05F 1/562* (2013.01); *G05F 1/565* (2013.01); *G05F 1/575* (2013.01); *H02M 3/157* (2013.01); *H03K 5/00* (2013.01); *H03K 2005/00078* (2013.01)

(58) Field of Classification Search
CPC .......... G05F 1/562; G05F 1/565; G05F 1/575; H02M 3/157

USPC ............................................ 323/283, 311, 312
See application file for complete search history.

(56) References Cited

U.S. PATENT DOCUMENTS

| | | | | |
|---|---|---|---|---|
| 5,514,995 | A * | 5/1996 | Hennig | G05F 1/565 327/170 |
| 6,304,069 | B1 * | 10/2001 | Tatsumi | G05F 1/465 323/312 |
| 2004/0119453 | A1 * | 6/2004 | Clark | G05F 1/56 323/283 |
| 2013/0328537 | A1 * | 12/2013 | Doorn | H02M 3/156 323/271 |
| 2014/0021933 | A1 * | 1/2014 | Gladish | H02M 1/08 323/311 |
| 2014/0062450 | A1 * | 3/2014 | Oshima | H03K 17/08122 323/311 |
| 2016/0006429 | A1 * | 1/2016 | Mori | H02M 1/088 323/312 |

(Continued)

*Primary Examiner* — Gary A Nash
(74) *Attorney, Agent, or Firm* — Muncy, Geissler, Olds & Lowe, PC

(57) ABSTRACT

A digital regulator at least includes a comparator, a hysteresis comparator, a first control circuit, a second control circuit, a first transistor, and a second transistor. The comparator compares a reference voltage with an internal voltage, so as to generate a first control voltage. The hysteresis comparator compares the reference voltage with the internal voltage, so as to generate a second control voltage. The first transistor is coupled between a relatively high internal voltage and a control node. The first transistor is controlled by the first control circuit according to the first control voltage and the second control voltage. The second transistor is coupled between the control node and the internal voltage. The second transistor is controlled by the second control circuit according to the first control voltage and the second control voltage.

15 Claims, 4 Drawing Sheets

(56) References Cited

U.S. PATENT DOCUMENTS

2016/0079785 A1* 3/2016 Kinzer ................. H02J 7/0052
320/107

* cited by examiner

DIGITAL REGULATOR

CROSS REFERENCE TO RELATED APPLICATIONS

This Application claims priority of Taiwan Patent Application No. 107116589 filed on May 16, 2018, the entirety of which is incorporated by reference herein.

BACKGROUND OF THE INVENTION

Field of the Invention

The disclosure generally relates to a digital regulator, and more specifically, to a digital regulator for increasing the operation speed of circuitry.

Description of the Related Art

With the development of DRAM (Dynamic Random Access Memory), external voltage has become closer to internal voltage, but the operation frequency of DRAM has become higher. For example, the current LPDDR3 (Low Power Double Data Rate 3) DRAM has an external voltage which is higher than the internal voltage by only 0.2V. However, too low an external voltage tends to degrade the performance and operation speed of the circuitry. Thus, the response speed and output capabilities of LDO (Low Dropout Regulator) play an important role. Conventional LDOs can be classified as analog type and digital type. The analog LDO is relatively large, and it cannot satisfy the requirements of miniaturization. The digital LDO faces the problem of its internal voltage having too large a swing range. Accordingly, there is a need to propose a novel design for replacing the conventional analog LDO. The proposed design should have a small total circuit area and provide a relatively large output driving current for increasing the operation speed of the whole circuitry.

SUMMARY OF THE INVENTION

In a preferred embodiment, the invention is directed to a digital regulator including a comparator, a hysteresis comparator, a first level shifter, a pre-driver, a first control circuit, a second control circuit, a first transistor, a second transistor, and a third transistor. The comparator is coupled to a first external voltage. The comparator is configured to compare a reference voltage with an internal voltage, so as to generate a first control voltage. The hysteresis comparator is coupled to the first external voltage. The hysteresis comparator is configured to compare the reference voltage with the internal voltage, so as to generate a second control voltage. The first level shifter is coupled to a relatively high internal voltage. The first level shifter generates a pre-control voltage according to the first control voltage. The pre-driver is coupled to the relatively high internal voltage. The pre-driver generates a gate control voltage at a control node according to the pre-control voltage. The first control circuit generates a third control voltage according to the first control voltage and the second control voltage. The second control circuit generates a fourth control voltage according to the first control voltage and the second control voltage. The first transistor has a control terminal for receiving the third control voltage, a first terminal coupled to the relatively high internal voltage, and a second terminal coupled to the control node. The second transistor has a control terminal for receiving the fourth control voltage, a first terminal coupled to the internal voltage, and a second terminal coupled to the control node. The third transistor has a control terminal coupled to the control node, a first terminal coupled to the internal voltage, and a second terminal coupled to a second external voltage.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are described in detail as follows.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
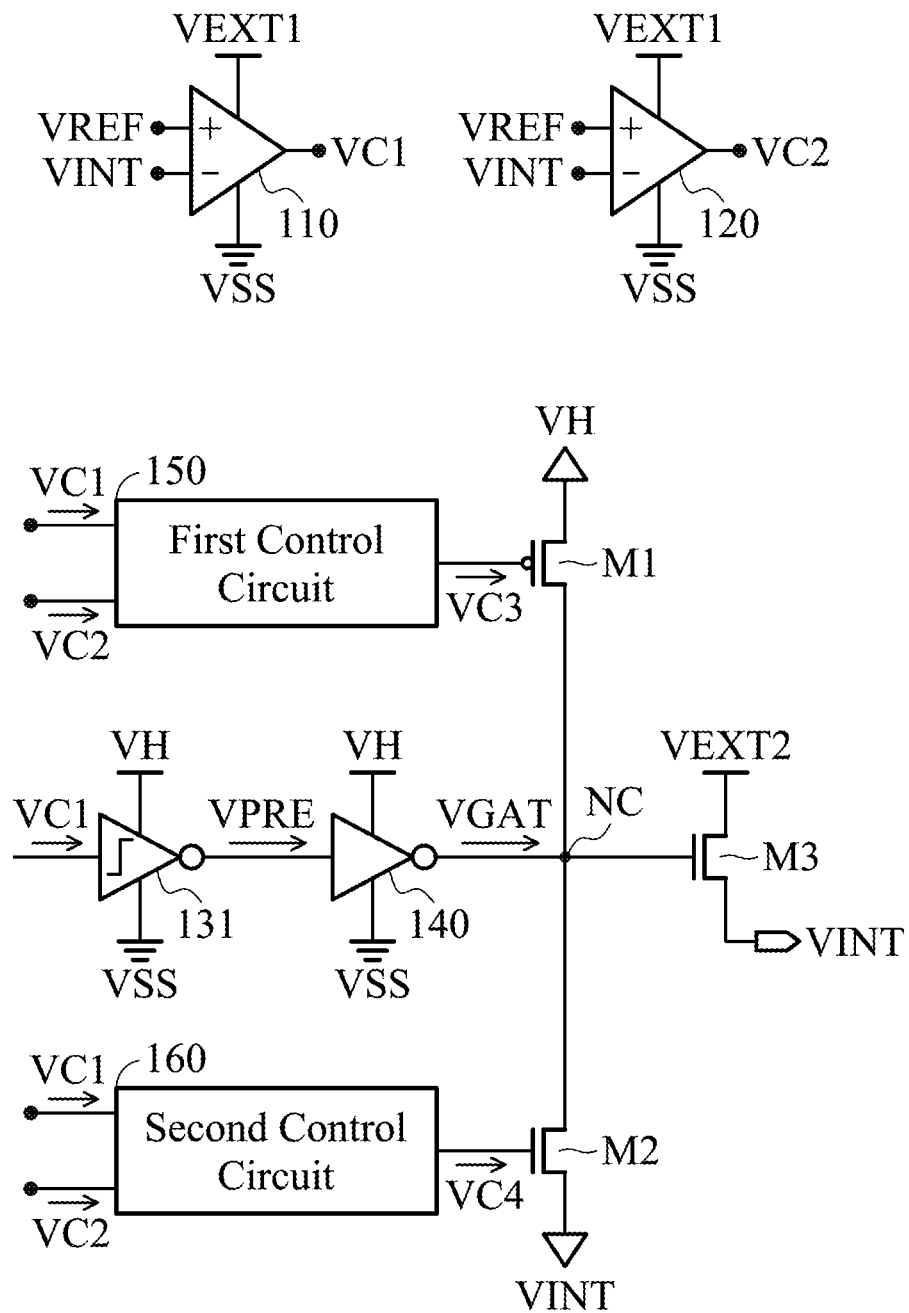
FIG. 1 is a diagram of a digital regulator according to an embodiment of the invention.

FIG. 1 is a diagram of a digital regulator 100 according to an embodiment of the invention. In the embodiment of FIG. 1, the digital regulator 100 includes a comparator 110, a hysteresis comparator 120, a first level shifter 131, a pre-driver 140, a first control circuit 150, a second control circuit 160, a first transistor M1, a second transistor M2, and a third transistor M3.

The comparator 110 may be an OP (Operational Amplifier). The comparator 110 is coupled between a first external voltage VEXT1 and a ground voltage VSS, and is supplied with the first external voltage VEXT1. Generally, the comparator 110 is configured to compare a reference voltage VREF with an internal voltage VINT, so as to generate a first control voltage VC1. In this embodiment, the comparator 110 has a positive input terminal for receiving the reference voltage VREF, a negative input terminal for receiving the internal voltage VINT, and an output terminal for outputting the first control voltage VC1. Please refer to FIG. 2 together. When the internal voltage VINT is lower than the reference voltage VREF, the first control voltage VC1 may be equal to the first external voltage VEXT1. Conversely, when the internal voltage VINT is higher than the reference voltage VREF, the first control voltage VC1 may be equal to the ground voltage VSS.

The hysteresis comparator 120 may have hysteresis characteristics. The hysteresis comparator 120 is coupled between the first external voltage VEXT1 and the ground voltage VSS, and is supplied with the first external voltage VEXT1. Generally, the hysteresis comparator 120 is configured to compare the reference voltage VREF with the internal voltage VINT, so as to generate a second control voltage VC2. In this embodiment, the hysteresis comparator 120 has a positive input terminal for receiving the reference voltage VREF, a negative input terminal for receiving the internal voltage VINT, and an output terminal for outputting the second control voltage VC2. Please refer to FIG. 2 together. When the internal voltage VINT is lower than the reference voltage VREF minus a voltage difference VD (i.e., VREF−VD), the second control voltage VC2 may rise from the ground voltage VSS to the first external voltage VEXT1. Conversely, when the internal voltage VINT is higher than the reference voltage VREF plus the voltage difference VD (i.e., VREF+VD), the second control voltage VC2 may drop from the first external voltage VEXT1 to the ground voltage VSS. In one embodiment, the magnitude of the voltage difference VD is determined according to the sizes of internal elements of the hysteresis comparator 120. For example, the reference voltage VREF may be 1V, and the voltage difference VD may be 0.05V, but the invention is not limited thereto.

The first level shifter 131 is coupled between a relatively high internal voltage VH and the ground voltage VSS, and is supplied with the relatively high internal voltage VH. Generally, the first level shifter 131 generates a pre-control voltage VPRE according to the first control voltage VC1. The first control voltage VC1 and the pre-control voltage VPRE may have different operation ranges. For example, the maximum of the first control voltage VC1 may be equal to the first external voltage VEXT1, the minimum of the first control voltage VC1 may be equal to the ground voltage VSS, the maximum of the pre-control voltage VPRE may be equal to the relatively high internal voltage VH, and the minimum of the pre-control voltage VPRE may be equal to the ground voltage VSS. The first level shifter 131 may be implemented with an inverting circuit (e.g., an inverter but not limited thereto), such that the pre-control voltage VPRE and the first control voltage VC1 may have complementary logic levels.

The pre-driver 140 is coupled between the relatively high internal voltage VH and the ground voltage VSS, and is supplied with the relatively high internal voltage VH. Generally, the pre-driver 140 generates a gate control voltage VGAT at a control node NC according to the pre-control voltage VPRE. The pre-driver 140 may be implemented with an inverter having a strong capability of driving a current. For example, the transistor sizes of the pre-driver 140 may be larger than the transistor sizes of the first level shifter 131. Thus, the gate control voltage VGAT and the pre-control voltage VPRE may have complementary logic levels, and the gate control voltage VGAT and the first control voltage VC1 may have the same logic levels.

The first control circuit 150 generates a third control voltage VC3 according to the first control voltage VC1 and the second control voltage VC2. The second control circuit 160 generates a fourth control voltage VC4 according to the first control voltage VC1 and the second control voltage VC2.

The first transistor M1 may be a PMOS transistor (P-type Metal Oxide Semiconductor Field Effect Transistor). Specifically, the first transistor M1 has a control terminal for receiving the third control voltage VC3, a first terminal coupled to the relatively high internal voltage VH, and a second terminal coupled to the control node NC.

The second transistor M2 may be an NMOS transistor (N-type Metal Oxide Semiconductor Field Effect Transistor). Specifically, the second transistor M2 has a control terminal for receiving the fourth control voltage VC4, a first terminal coupled to the internal voltage VINT, and a second terminal coupled to the control node NC.

The third transistor M3 may be an NMOS transistor. Specifically, the third transistor M3 has a control terminal coupled to the control node NC for receiving the gate control voltage VGAT, a first terminal coupled to the internal voltage VINT, and a second terminal coupled to a second external voltage VEXT2. The digital regulator 100 outputs the internal voltage VINT and fine-tunes the operations of the comparator 110 and the hysteresis comparator 120 using a negative feedback mechanism. Therefore, the internal voltage VINT can be automatically calibrated and maintained within an optimized output range.

It should be noted that over the disclosure, the so-called "internal" voltages mean the voltages generated by internal circuits of the electronic device, and the so-called "external" voltages mean the voltages applied by users. In some embodiments, the relatively high internal voltage VH is higher than the first external voltage VEXT1, and the first external voltage VEXT1 is higher than the second external voltage VEXT2.

Figure 2:
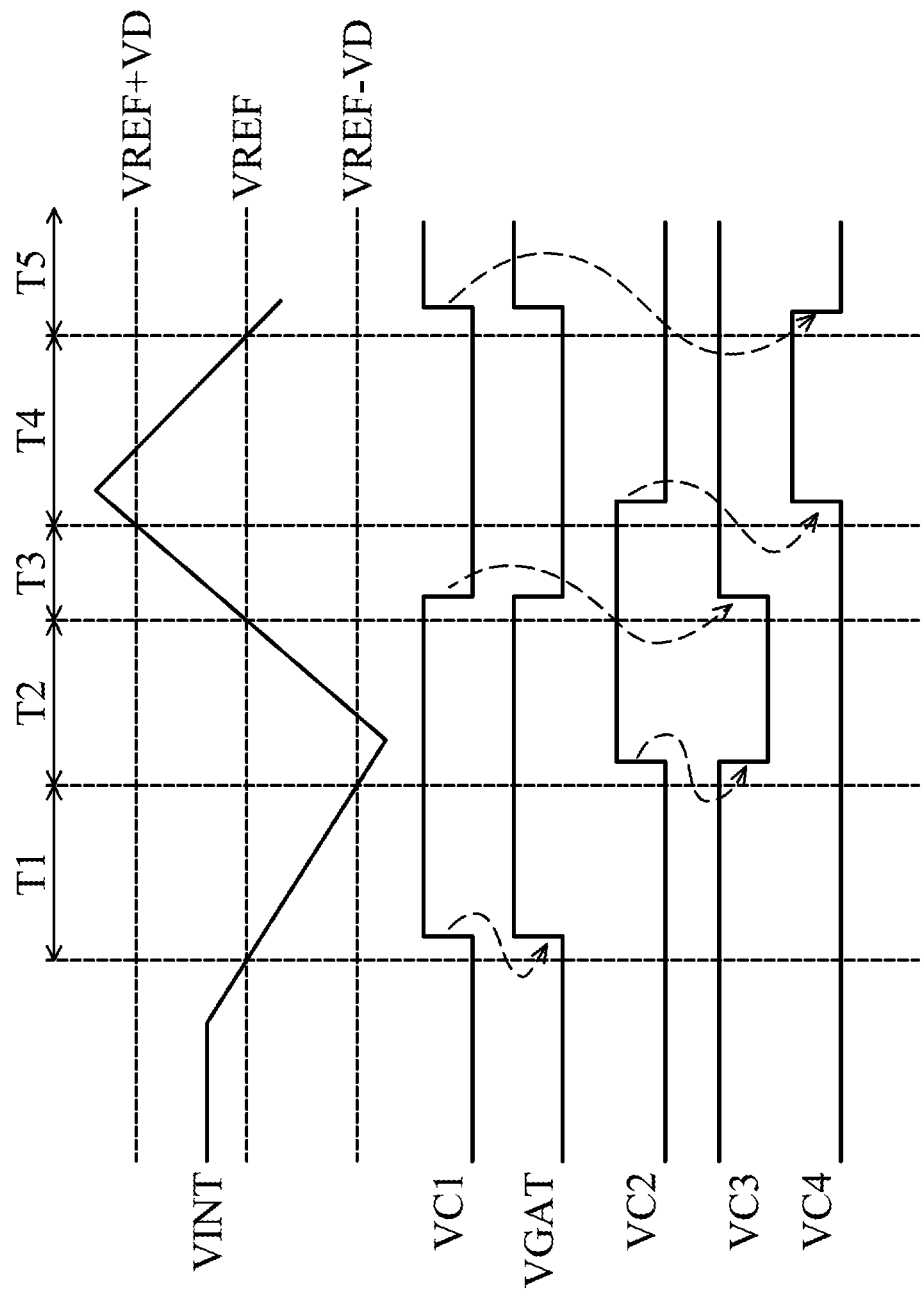
FIG. 2 is a diagram of voltage waveforms of a digital regulator according to an embodiment of the invention.

FIG. 2 is a diagram of voltage waveforms of the digital regulator 100 according to an embodiment of the invention. The horizontal axis represents time, and the vertical axis represents voltage levels. According to FIG. 2, the switching conditions of the third control voltage VC3 are as follows. Within a time interval T2, in response to the second control voltage VC2 rising from the ground voltage VSS to the first external voltage VEXT1 (i.e., at a rising edge of the second control voltage VC2), the third control voltage VC3 may drop from the relatively high internal voltage VH to the ground voltage VSS. Within a time interval T3, in response to the first control voltage VC1 dropping from the first external voltage VEXT1 to the ground voltage VSS (i.e., at a falling edge of the first control voltage VC1), the third control voltage VC3 may rise from the ground voltage VSS to the relatively high internal voltage VH. In other words, the third control voltage VC3 may be pulled down to a low logic level on the condition that the internal voltage VINT is lower than the reference voltage VREF minus the voltage difference VD, and the third control voltage VC3 may be pulled up to a high logic level on the condition that the internal voltage VINT is higher than the reference voltage VREF. Therefore, when the internal voltage VINT is too low, the turned-on operation of the first transistor M1 can cause the gate control voltage VGAT to be charged up, so as to pull up the internal voltage VINT back to a normal level (e.g., the reference voltage VREF).

In addition, as shown in FIG. 2, the switching conditions of the fourth control voltage VC4 are as follows. Within a time interval T4, in response to the second control voltage VC2 dropping from the first external voltage VEXT1 to the ground voltage VSS (e.g., at a falling edge of the second control voltage VC2), the fourth control voltage VC4 may rise from the ground voltage VSS to the relatively high internal voltage VH. Within a time interval T5, in response to the first control voltage VC1 rising from the ground voltage VSS to the first external voltage VEXT1 (i.e., at a rising edge of the first control voltage VC1), the fourth control voltage VC4 may drop from the relatively high internal voltage VH to the ground voltage VSS. In other words, the fourth control voltage VC4 may be pulled up to a high logic level on the condition that the internal voltage VINT is higher than the reference voltage VREF plus the voltage difference VD, and the third control voltage VC4 may be pulled down to a low logic level on the condition that the internal voltage VINT is lower than the reference voltage VREF. Therefore, when the internal voltage VINT is too high, the turned-on operation of the second transistor M2 can cause the gate control voltage VGAT to be discharged down, so as to pull down the internal voltage VINT back to a normal level (e.g., the reference voltage VREF).

Figure 3:
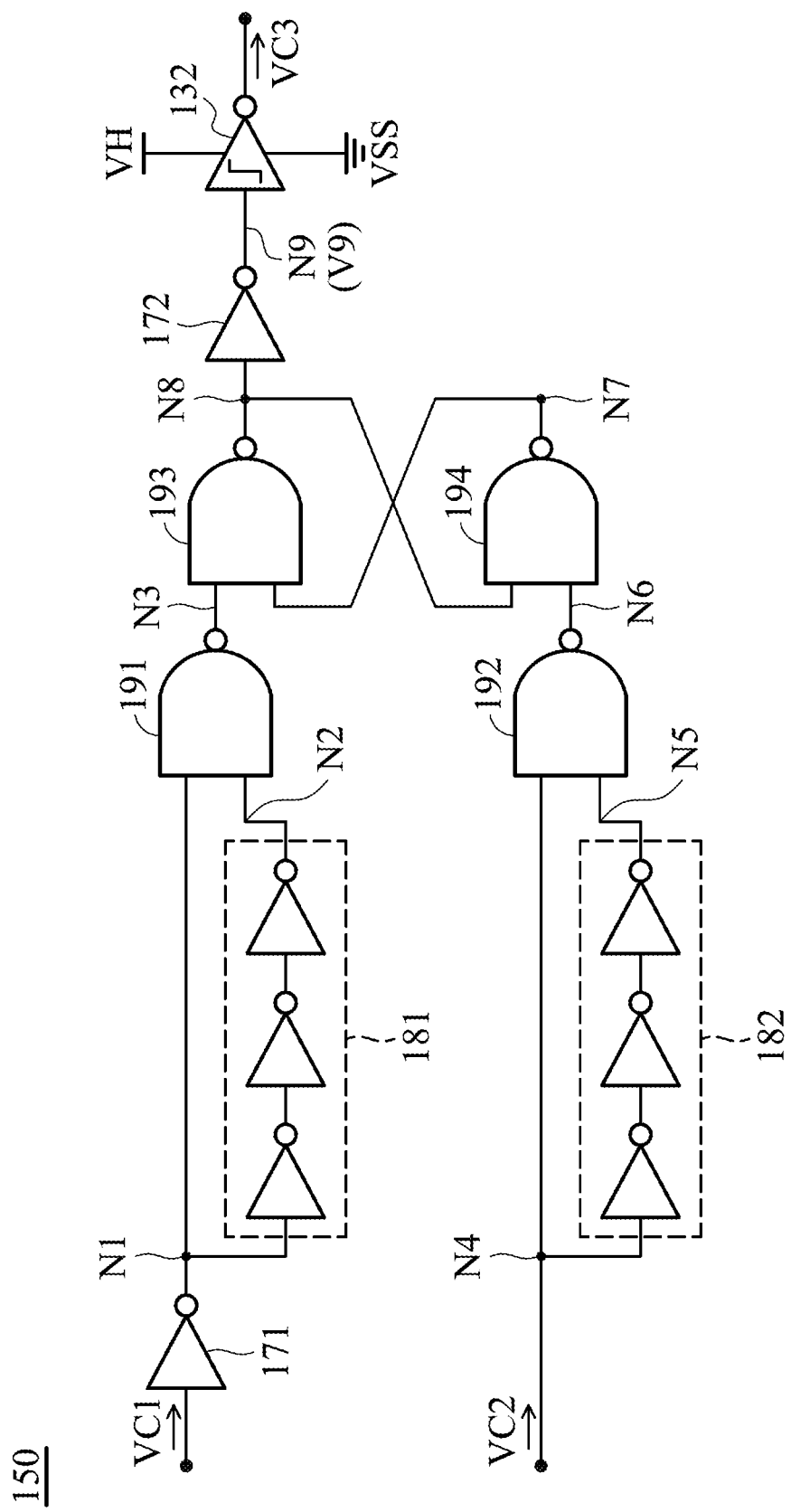
FIG. 3 is a diagram of a first control circuit according to an embodiment of the invention.

FIG. 3 is a diagram of the first control circuit 150 according to an embodiment of the invention. In this embodiment, the first control circuit 150 includes a first inverter 171, a second inverter 172, a first inverting delay chain 181, a second inverting delay chain 182, a first NAND gate 191, a second NAND gate 192, a third NAND gate 193, a fourth NAND gate 194, and a second level shifter 132. Each of the first inverting delay chain 181 and the second inverting delay chain 182 includes an odd number of cascading inverters, and the odd number is greater than or equal to 3, such as 3, 5, 7, 9 or more. It should be understood that these inverters and these NAND gates are all coupled between the first external voltage VEXT1 and the ground voltage VSS, and they are all supplied with the first external voltage VEXT1. The first inverter 171 has an input terminal for receiving the first control voltage VC1, and an output terminal coupled to a first node N1. The first inverting delay chain 181 has an input terminal coupled to the first node N1, and an output terminal coupled to a second node N2. The first NAND gate 191 has a first input terminal coupled to the first node N1, a second input terminal coupled to the second node N2, and an output terminal coupled to a third node N3. The second inverting delay chain 182 has an input terminal coupled to a fourth node N4 for receiving the second control voltage VC2, and an output terminal coupled to a fifth node N5. The second NAND gate 192 has a first input terminal coupled to the fourth node N4, a second input terminal coupled to the fifth node N5, and an output terminal coupled to a sixth node N6. The third NAND gate 193 has a first input terminal coupled to the third node N3, a second input terminal coupled to a seventh node N7, and an output terminal coupled to an eighth node N8. The fourth NAND gate 194 has a first input terminal coupled to the eighth node N8, a second input terminal coupled to the sixth node N6, and an output terminal coupled to the seventh node N7. The second inverter 172 has an input terminal coupled to the eighth node N8, and an output terminal coupled to a ninth node N9. The second level shifter 132 is coupled between the relatively high internal voltage VH and the ground voltage VSS, and is supplied with the relatively high internal voltage VH. Generally, the second level shifter 132 generates the third control voltage VC3 according to the voltage V9 at the ninth node N9. The voltage V9 at the ninth node N9 and the third control voltage VC3 may have different operation ranges. For example, the voltage V9 at the ninth node N9 may have an operation range between the first external voltage VEXT1 and the ground voltage VSS, and the third control voltage VC3 may have an operation range between the relatively high internal voltage VH and the ground voltage VSS. The second level shifter 132 may be implemented with an inverting circuit (e.g., an inverter but not limited thereto), such that the third control voltage VC3 and the voltage V9 at the ninth node N9 may have complementary logic levels. The first control circuit 150 may be considered as a combination of an edge-trigger circuit and a latch circuit, and it is configured to detect the rising edges of the second control voltage VC2 and the falling edges of the first control voltage VC1.

Figure 4:
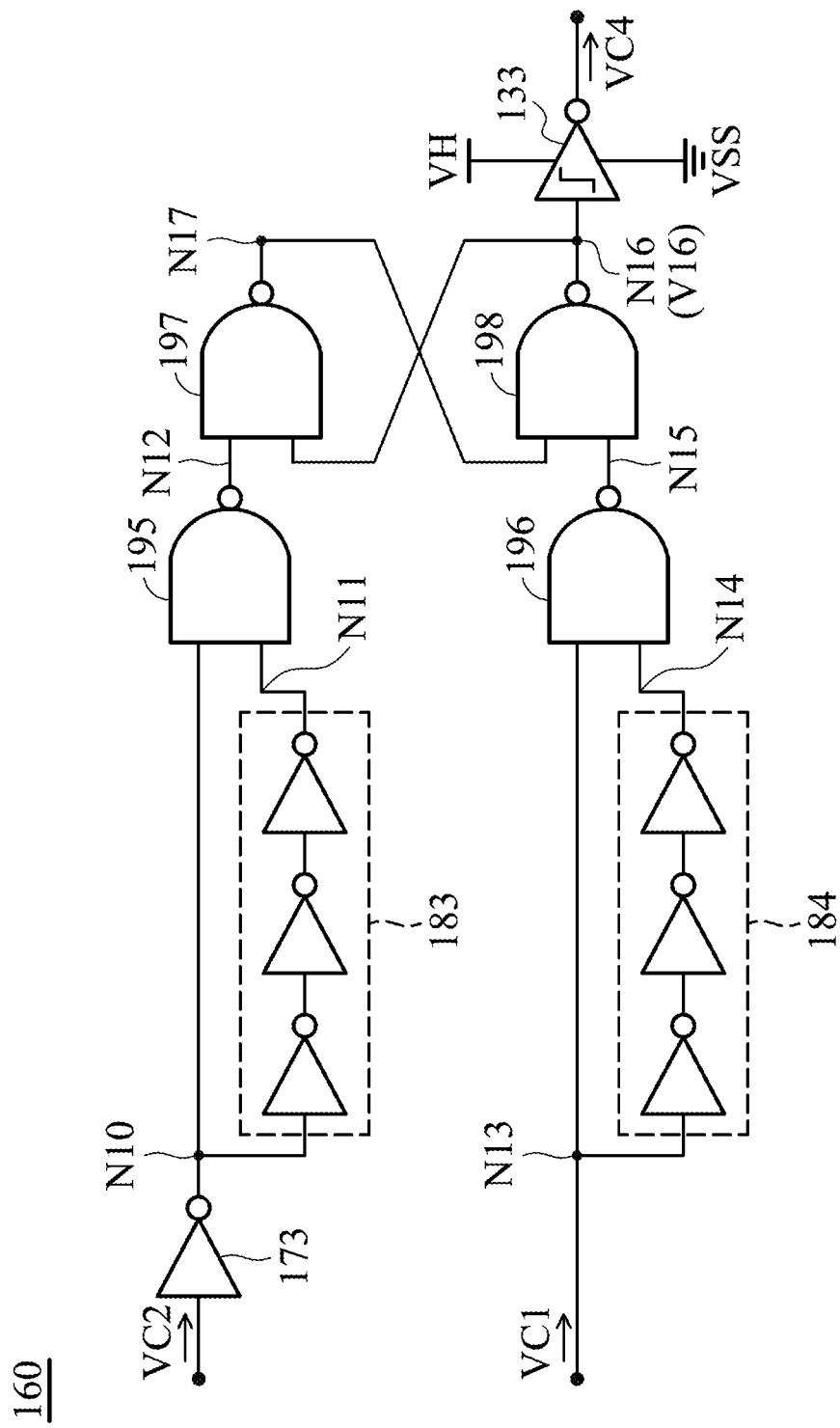
FIG. 4 is a diagram of a second control circuit according to an embodiment of the invention.

FIG. 4 is a diagram of the second control circuit 160 according to an embodiment of the invention. In this embodiment, the second control circuit 160 includes a third inverter 173, a third inverting delay chain 183, a fourth inverting delay chain 184, a fifth NAND gate 195, a sixth NAND gate 196, a seventh NAND gate 197, an eighth NAND gate 198, and a third level shifter 133. Each of the third inverting delay chain 183 and the fourth inverting delay chain 184 includes an odd number of cascading inverters, and the odd number is greater than or equal to 3. It should be understood that these inverters and these NAND gates are all coupled between the first external voltage VEXT1 and the ground voltage VSS, and they are all supplied with the first external voltage VEXT1. The third inverter 173 has an input terminal for receiving the second control voltage VC2, and an output terminal coupled to a tenth node N10. The third inverting delay chain 183 has an input terminal coupled to the tenth node N10, and an output terminal coupled to an eleventh node N11. The fifth NAND gate 195 has a first input terminal coupled to the tenth node N10, a second input terminal coupled to the eleventh node N11, and an output terminal coupled to a twelfth node N12. The fourth inverting delay chain 184 has an input terminal coupled to a thirteenth node N13 for receiving the first control voltage VC1, and an output terminal coupled to a fourteenth node N14. The sixth NAND gate 196 has a first input terminal coupled to the thirteenth node N13, a second input terminal coupled to the fourteenth node N14, and an output terminal coupled to a fifteenth node N15. The seventh NAND gate 197 has a first input terminal coupled to the twelfth node N12, a second input terminal coupled to a sixteenth node N16, and an output terminal coupled to a seventeenth node N17. The eighth NAND gate 198 has a first input terminal coupled to the seventeenth node N17, a second input terminal coupled to the fifteenth node N15, and an output terminal coupled to the sixteenth node N16. The third level shifter 133 is coupled between the relatively high internal voltage VH and the ground voltage VSS, and is supplied with the relatively high internal voltage VH. Generally, the third level shifter 133 generates the fourth control voltage VC4 according to the voltage V16 at the sixteenth node N16. The voltage V16 at the sixteenth node N16 and the fourth control voltage VC4 may have different operation ranges. For example, the voltage V16 at the sixteenth node N16 may have an operation range between the first external voltage VEXT1 and the ground voltage VSS, and the fourth control voltage VC4 may have an operation range between the relatively high internal voltage VH and the ground voltage VSS. The third level shifter 133 may be implemented with an inverting circuit (e.g., an inverter but not limited thereto), such that the fourth control voltage VC4 and the voltage V16 at the sixteenth node N16 may have complementary logic levels. The second control circuit 160 may be considered as a combination of another edge-trigger circuit and another latch circuit, and it is configured to detect the falling edges of the second control voltage VC2 and the rising edges of the first control voltage VC1.

It should be understood that if the slew rate of the gate control voltage VGAT of the pre-driver 140 is too large, the third transistor M3 may have too large an output driving current, such that the internal voltage VINT may become too high; conversely, if the slew rate of the gate control voltage VGAT of the pre-driver 140 is too small, the third transistor M3 may have too small an output driving current, such that the internal voltage VINT may become too low. Too high or too low an internal voltage VINT may negatively affect the operation performance and speed of the digital regulator 100. Therefore, the invention uses the first transistor M1, the second transistor M2 and their corresponding comparators and control circuits for automatically and dynamically adjusting the slew rate of the gate control voltage VGAT, thereby limiting and optimizing the operation range of the internal voltage VINT. Furthermore, the incorporation of the hysteresis comparator 120 can reduce the total number of required reference voltages VREF, so as to simplify the whole circuit complexity and reduce the total manufacturing cost. With such a design, the operational performance and speed of the proposed digital regulator 100 of the invention is effectively improved, and no additional circuit area is required.

Note that the above voltages, voltage differences, and other element parameters are not limitations of the invention. A designer can adjust these settings according to different requirements. The digital regulator of the invention is not limited to the configurations of FIGS. 1-4 The invention may merely include any one or more features of any one or more embodiments of FIGS. 1-4. In other words, not all of the features displayed in the figures should be implemented in the digital regulator of the invention.

It will be apparent to those skilled in the art that various modifications and variations can be made in the invention. It is intended that the standard and examples be considered exemplary only, with the true scope of the disclosed embodiments being indicated by the following claims and their equivalents.

What is claimed is:

1. A digital regulator, comprising:
   a comparator, coupled to a first external voltage, wherein the comparator is configured to compare a reference voltage with an internal voltage, so as to generate a first control voltage;
   a hysteresis comparator, coupled to the first external voltage, wherein the hysteresis comparator is configured to compare the reference voltage with the internal voltage, so as to generate a second control voltage;
   a first level shifter, coupled to a relatively high internal voltage, wherein the first level shifter generates a pre-control voltage according to the first control voltage;
   a pre-driver, coupled to the relatively high internal voltage, wherein the pre-driver generates a gate control voltage at a control node according to the pre-control voltage;
   a first control circuit, generating a third control voltage according to the first control voltage and the second control voltage;
   a second control circuit, generating a fourth control voltage according to the first control voltage and the second control voltage;
   a first transistor, wherein the first transistor has a control terminal for receiving the third control voltage, a first terminal coupled to the relatively high internal voltage, and a second terminal coupled to the control node;
   a second transistor, wherein the second transistor has a control terminal for receiving the fourth control voltage, a first terminal coupled to the internal voltage, and a second terminal coupled to the control node; and
   a third transistor, wherein the third transistor has a control terminal coupled to the control node, a first terminal coupled to the internal voltage, and a second terminal coupled to a second external voltage.

2. The digital regulator as claimed in claim 1, wherein the first transistor is a PMOS transistor (P-type Metal Oxide Semiconductor Field Effect Transistor), and each of the second transistor and the third transistor is an NMOS transistor (N-type Metal Oxide Semiconductor Field Effect Transistor).

3. The digital regulator as claimed in claim 1, wherein the relatively high internal voltage is higher than the first external voltage, and the first external voltage is higher than the second external voltage.

4. The digital regulator as claimed in claim 1, wherein in response to the internal voltage being lower than the reference voltage, the first control voltage is equal to the first external voltage, and wherein in response to the internal voltage being higher than the reference voltage, the first control voltage is equal to a ground voltage.

5. The digital regulator as claimed in claim 1, wherein in response to the internal voltage being lower than the reference voltage minus a voltage difference, the second control voltage rises from a ground voltage to the first external voltage, and wherein in response to the internal voltage being higher than the reference voltage plus the voltage difference, the second control voltage drops from the first external voltage to the ground voltage.

6. The digital regulator as claimed in claim 1, wherein a maximum of the first control voltage is equal to the first external voltage, and wherein a maximum of the pre-control voltage is equal to the relatively high internal voltage.

7. The digital regulator as claimed in claim 1, wherein the pre-driver comprises an inverter, and wherein the inverter of the pre-driver has a stronger capability of driving an output current than the first level shifter does.

8. The digital regulator as claimed in claim 1, wherein in response to the second control voltage rising to the first external voltage, the third control voltage drops from the relatively high internal voltage to a ground voltage, and wherein in response to the first control voltage dropping to the ground voltage, the third control voltage rises from the ground voltage to the relatively high internal voltage.

9. The digital regulator as claimed in claim 1, wherein in response to the second control voltage dropping to a ground voltage, the fourth control voltage rises from the ground voltage to the relatively high internal voltage, and wherein in response to the first control voltage rising to the first external voltage, the fourth control voltage drops from the relatively high internal voltage to the ground voltage.

10. The digital regulator as claimed in claim 1, wherein the first control circuit comprises:
   a first inverter, wherein the first inverter has an input terminal for receiving the first control voltage, and an output terminal coupled to a first node;
   a first inverting delay chain, wherein the first inverting delay chain has an input terminal coupled to the first node, and an output terminal coupled to a second node;
   a first NAND gate, wherein the first NAND gate has a first input terminal coupled to the first node, a second input terminal coupled to the second node, and an output terminal coupled to a third node;
   a second inverting delay chain, wherein the second inverting delay chain has an input terminal coupled to a fourth node for receiving the second control voltage, and an output terminal coupled to a fifth node;
   a second NAND gate, wherein the second NAND gate has a first input terminal coupled to the fourth node, a second input terminal coupled to the fifth node, and an output terminal coupled to a sixth node;
   a third NAND gate, wherein the third NAND gate has a first input terminal coupled to the third node, a second input terminal coupled to a seventh node, and an output terminal coupled to an eighth node;

a fourth NAND gate, wherein the fourth NAND gate has a first input terminal coupled to the eighth node, a second input terminal coupled to the sixth node, and an output terminal coupled to the seventh node;

a second inverter, wherein the second inverter has an input terminal coupled to the eighth node, and an output terminal coupled to a ninth node; and a second level shifter, coupled to the relatively high internal voltage, wherein the second level shifter generates the third control voltage according to a voltage at the ninth node.

11. The digital regulator as claimed in claim 10, wherein a maximum of the voltage at the ninth node is equal to the first external voltage, and wherein a maximum of the third control voltage is equal to the relatively high internal voltage.

12. The digital regulator as claimed in claim 10, wherein each of the first inverting delay chain and the second inverting delay chain comprises an odd number of cascading inverters, and wherein the odd number is greater than or equal to 3.

13. The digital regulator as claimed in claim 1, wherein the second control circuit comprises:

a third inverter, wherein the third inverter has an input terminal for receiving the second control voltage, and an output terminal coupled to a tenth node;

a third inverting delay chain, wherein the third inverting delay chain has an input terminal coupled to the tenth node, and an output terminal coupled to an eleventh node;

a fifth NAND gate, wherein the fifth NAND gate has a first input terminal coupled to the tenth node, a second input terminal coupled to the eleventh node, and an output terminal coupled to a twelfth node;

a fourth inverting delay chain, wherein the fourth inverting delay chain has an input terminal coupled to a thirteenth node for receiving the first control voltage, and an output terminal coupled to a fourteenth node;

a sixth NAND gate, wherein the sixth NAND gate has a first input terminal coupled to the thirteenth node, a second input terminal coupled to the fourteenth node, and an output terminal coupled to a fifteenth node;

a seventh NAND gate, wherein the seventh NAND gate has a first input terminal coupled to the twelfth node, a second input terminal coupled to a sixteenth node, and an output terminal coupled to a seventeenth node;

an eighth NAND gate, wherein the eighth NAND gate has a first input terminal coupled to the seventeenth node, a second input terminal coupled to the fifteenth node, and an output terminal coupled to the sixteenth node; and a third level shifter, coupled to the relatively high internal voltage, wherein the third level shifter generates the fourth control voltage according to a voltage at the sixteenth node.

14. The digital regulator as claimed in claim 13, wherein a maximum of the voltage at the sixteenth node is equal to the first external voltage, and wherein a maximum of the fourth control voltage is equal to the relatively high internal voltage.

15. The digital regulator as claimed in claim 13, wherein each of the third inverting delay chain and the fourth inverting delay chain comprises an odd number of cascading inverters, and wherein the odd number is greater than or equal to 3.

* * * * *